(12) United States Patent
Whelan et al.

(10) Patent No.: US 7,728,436 B2
(45) Date of Patent: Jun. 1, 2010

(54) METHOD FOR SELECTIVE DEPOSITION OF A THIN SELF-ASSEMBLED MONOLAYER

(75) Inventors: Caroline Whelan, Hanret (BE); Victor Sutcliffe, Frisco, TX (US)

(73) Assignees: IMEC, Leuven (BE); Texas Instruments Inc., Dallas, TX (US)

( * ) Notice: Subject to any disclaimer, the term of this patent is extended or adjusted under 35 U.S.C. 154(b) by 0 days.

(21) Appl. No.: 11/971,777

(22) Filed: Jan. 9, 2008

(65) Prior Publication Data

US 2008/0105979 A1   May 8, 2008

Related U.S. Application Data

(62) Division of application No. 11/296,033, filed on Dec. 7, 2005, now Pat. No. 7,368,377.

(60) Provisional application No. 60/634,900, filed on Dec. 9, 2004.

(51) Int. Cl.
*H01L 23/48* (2006.01)

(52) U.S. Cl. ............... 257/759; 257/762; 257/E23.165

(58) Field of Classification Search ................ 257/616, 257/759, 762, E23.154, E23.161, E23.165, 257/E23.167
See application file for complete search history.

(56) References Cited

U.S. PATENT DOCUMENTS

| | | |
|---|---|---|
| 6,348,240 B1 | 2/2002 | Calvert et al. |
| 6,518,168 B1 | 2/2003 | Clem et al. |
| 6,919,636 B1 | 7/2005 | Ryan |
| 7,138,333 B2 | 11/2006 | Schmidt et al. |
| 2002/0079487 A1 | 6/2002 | Ramanath et al. |

*Primary Examiner*—Lex Malsawma
(74) *Attorney, Agent, or Firm*—Knobbe Martens Olson & Bear LLP

(57) ABSTRACT

A method for selective deposition of self-assembled monolayers to the surface of a substrate for use as a diffusion barrier layer in interconnect structures is provided comprising the steps of depositing a first self-assembled monolayer to said surface, depositing a second self-assembled monolayer to the non-covered parts of said surface and subsequently heating said substrate to remove the first self-assembled monolayer. The method of selective deposition of self-assembled monolayers is applied for the use as diffusion barrier layers in a (dual) damascene structure for integrated circuits.

10 Claims, 9 Drawing Sheets

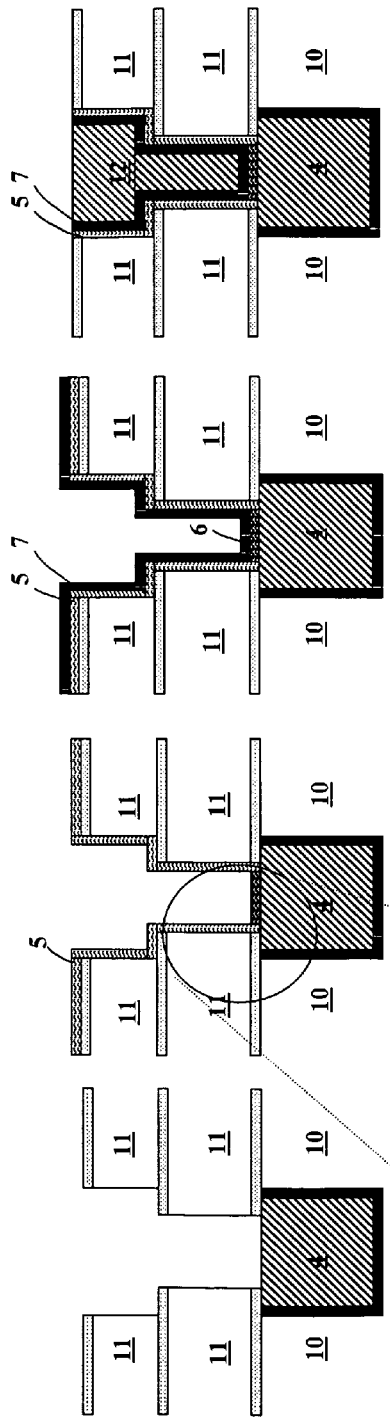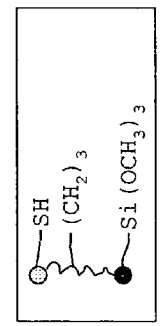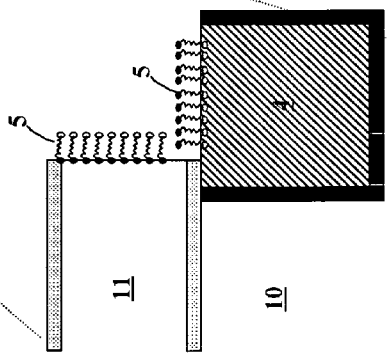

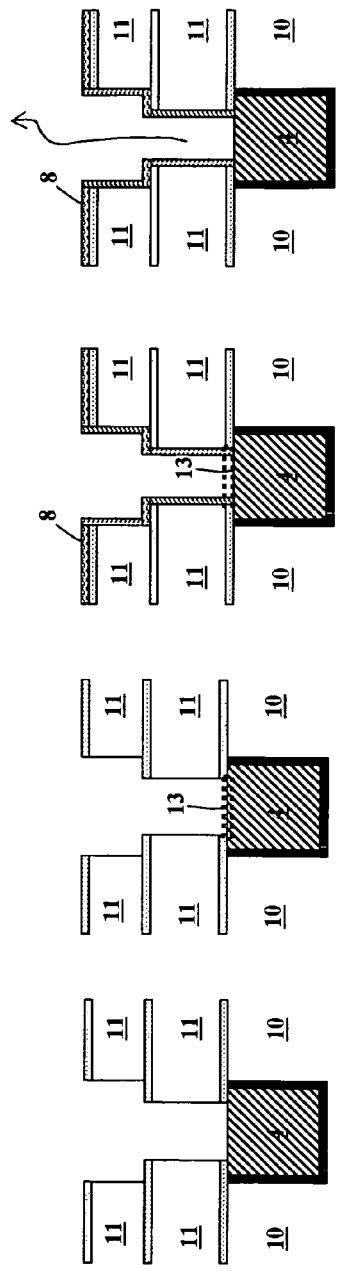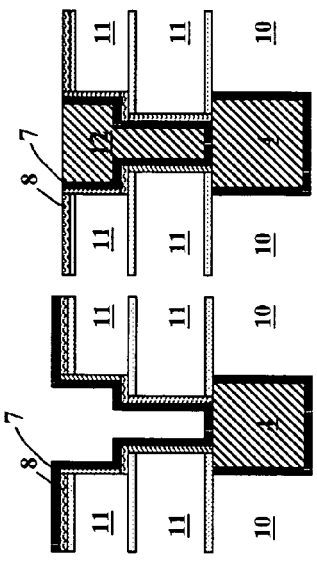
FIGURE 3

METHOD FOR SELECTIVE DEPOSITION OF A THIN SELF-ASSEMBLED MONOLAYER

CROSS-REFERENCE TO RELATED APPLICATIONS

This application is a divisional of Ser. No. 11/296,033, filed Dec. 7, 2005 now U.S. Pat. No. 7,368,377, which claims priority under 35 U.S.C. §119(e) to U.S. provisional application Ser. No. 60/634,900, filed Dec. 9, 2004, the disclosures of which are hereby incorporated by reference in their entirety and are hereby made a portion of this application.

FIELD OF THE INVENTION

The present invention is related to the field of semiconductor processing. More specifically it is related to the field of forming self-assembled monolayers for use as diffusion barrier layers. More specifically it is related to field of (e.g. copper) damascene advanced interconnect applications for integrated circuit (IC) manufacturing.

BACKGROUND OF THE INVENTION

Copper is the preferred metal for creating multilevel interconnect structures in ultra-large-scale-integrated circuits because of its high electrical conductivity and electromigration resistance. One of the major challenges in Cu metallization technology is the prevention of the rapid diffusion of Cu into adjoining layers of $SiO_2$ and related low-dielectric-constant materials (e.g., fluorinated $SiO_x$, SiOCH) during device operation. This is because Cu incorporation into the dielectric degrades the dielectric properties of the insulating layer, causing increased leakage currents, and leading to inferior device performance and failure.

The current industry standard is 10-30-nm-thick metallic diffusion barrier layers of Ti- or Ta-based compounds (such as Ta, TaN, TiSiN and TiN) or Cu-based alloys to alleviate this problem. While these approaches have been successful thus far, barriers with thicknesses below 5 nm will be needed at sub-100-nm feature sizes and in advanced future device architectures (e.g. three-dimensional integrated multiple-wafer devices) to fully realize the advantage of Cu interconnects. It is difficult to obtain such thin barriers with acceptable step coverage by conventional metal deposition methods (Plasma Vapor deposition (PVD) or Chemical Vapor Deposition (CVD)) without compromising the barrier-layer microstructure and/or their conformality in high-aspect-ratio features. Additionally thick diffusion barrier layers take up the volume meant for low-resistivity Cu, reducing the advantages of scaling (miniaturization).

Newly emerging methods such as atomic layer deposition (ALD) have the potential to obviate some of these concerns. However, to obtain conformal films with thicknesses below 5 nm of conventional barrier materials, it is not clear if they will be effective due to high defectivity. Hence, there is a great deal of interest in exploring alternative materials and processing methods.

Recently, Self-Assembled Monolayers (SAM) are reported to act as thin (generally <2 nm) Cu diffusion barrier layers (US 2002/0079487). With SAM layers comprising organo-silane molecules, Cu diffusion into the dielectric is inhibited and a good Cu adhesion at the $Cu/SiO_2$ interface is achieved. The use of said SAM layer in integrated circuit structures such as dual damascene structures wherein electrical contact is required between the metal line of interest to metal lines above or below the situation is more complicated. Deposition of said SAM layer (comprising organo-silane molecules) to the already existing metal structure will lead to poor adhesion of Cu seed layers prior to further Cu deposition and poor electrical conductivity later on in the finalized dual damascene structure.

SUMMARY OF THE INVENTION

The aim of the preferred embodiments is to provide a method for the selective deposition of a Self-Assembled Monolayer (SAM) by means of applying first a selective, releasable Self-Assembled Monolayer that acts as a masking layer such that a second permanent Self-Assembled Monolayer can be deposited. The second permanent SAM will be used as a Cu diffusion barrier deposited only on the dielectric material.

The preferred embodiments provide a method for selective deposition of a thin Self Assembled Mono-layer (SAM) which acts as a copper (Cu) diffusion barrier for use with copper damascene advanced interconnect applications for integrated circuit (IC) manufacturing.

The method for forming selective self-assembled monolayers comprises the steps of depositing a first releasable self-assembled monolayer (SAM-1) to a copper containing surface, depositing a second permanent self-assembled monolayer (SAM-2) to the non-copper containing parts of said surface and subsequently heating said substrate to remove the first self-assembled monolayer.

The preferred embodiments are developed for improved electrical and reliability characteristics of SAM Cu diffusion barriers when applied to dual damascene (DD) Cu interconnects.

The preferred embodiments solve the problem of applying a (non-selective) self-assembled monolayers for use as barrier layer in dual damascene structures as described in the prior art by depositing first a protective (sacrificial) self-assembled monolayer (referred to as SAM-1) selectively to the copper surface of an existing metal structure of a dual damascene structure before applying a second (permanent) self-assembled monolayer (referred to as SAM-2) to the non-copper parts of said dual damascene structure. By applying said sacrificial SAM-1 to the already existing copper surface of a dual damascene structure (also referred to as underlying metal layer n−1) said existing copper surface will be protected from non-selective adsorption of SAM-2. The release of the sacrificial SAM-1 after SAM-2 deposition on the dielectric makes it possible to create a good and direct copper to copper contact in the final dual damascene structure or in other words a good Cu—Cu contact between the via bottom (metal n) and the underlying metal (n−1) of a dual damascene structure can be achieved.

It is further an object of the preferred embodiments to provide a molecule suitable for use as a releasable self-assembled monolayer (SAM-1) to a copper containing surface and a product suitable for use as a second permanent self-assembled monolayer (SAM-2).

In a first aspect, a method for forming a self-assembled monolayer configured for use as a diffusion barrier in an interconnect structure, the method comprising the steps of providing a substrate having at least one opening, wherein the opening comprises a bottom part and at least one sidewall, the bottom part having a copper surface and the sidewall having at least one dielectric surface; selectively depositing a first self-assembled monolayer on the copper surface; thereafter selectively depositing a second self-assembled monolayer on the dielectric surface; and thereafter heating the substrate to remove the first self-assembled monolayer, wherein the remaining second self-assembled monolayer is configured for use as a diffusion barrier in an interconnect structure.

In an embodiment of the first aspect, the first self-assembled monolayer comprises a plurality of first molecules, wherein each first molecule comprises a first molecule head group, a first molecule chain portion, and a first molecule terminal group, wherein the first molecule chain portion comprises a hydrocarbon, and wherein the second self-assembled monolayer comprises a plurality of second molecules, wherein each second molecule comprises a second molecule head group, a second molecule chain portion, and a second molecule terminal group, wherein the second molecule chain portion comprises a hydrocarbon.

In an embodiment of the first aspect, the first self-assembled monolayer comprises a plurality of first molecules, each first molecule having a first head group, a first chain portion, and a first terminal group, wherein the first head group adheres more strongly to the copper surface than to the dielectric surface, wherein the first terminal group adheres weakly to the copper surface and adheres weakly to the dielectric surface, and wherein the first molecule has a low thermal stability.

In an embodiment of the first aspect, the step of heating the substrate is conducted at a temperature above 100 degrees Celsius, and wherein the first self-assembled monolayer has a low thermal stability at a temperature above about 100 degrees Celsius.

In an embodiment of the first aspect, the step of heating the substrate is conducted at a temperature of from about 100 degrees Celsius to about 150 degrees Celsius, and wherein the step of heating has a duration of at least about 1 minute.

In an embodiment of the first aspect, the second self-assembled monolayer comprises a plurality of second molecules, each second molecule having a second head group, a second chain portion, and a second terminal group, wherein the second head group adheres more strongly to the dielectric surface than to the copper surface, and wherein the second terminal group adheres weakly to the dielectric surface and strongly to the copper surface.

In an embodiment of the first aspect, the dielectric surface is a Si-based dielectric material.

In an embodiment of the first aspect, the first self-assembled monolayer comprises a plurality of molecules having a chemical formulae selected from the group consisting of X—$R_1$—SH, X—$R_1$—S—S—$R_2$—Y, $R_1$—S—$R_2$, and combinations thereof, wherein $R_1$ and $R_2$ are independently a carbon chain or a carbon chain interrupted by at least one heteroatom. X and Y can be chemical groups that essentially do not chemically react with the copper surface. At least one of $R_1$ and $R_2$ can be a chain of n carbon atoms, wherein n is an integer of preferably from 1 to 30, more preferably from 1 to 18, or most preferably from 6 to 16. At least one of $R_1$ and $R_2$ can be a chain of n carbon atoms interrupted by p heteroatoms, wherein n+p is an integer of preferably from 1 to 30, more preferably from 1 to 18, or most preferably from 6 to 16. The carbon chain can comprise a portion selected from the group consisting of alkyl, alkenyl, alkynyl, cyclic alkyl, aryl, alkyl bound to aryl, alkenyl bound to aryl, alkynyl bound to aryl, and combinations thereof X can be methyl or hydrogen. The first self-assembled monolayer can have a chemical formula $SH(CH_2)_9CH_3$.

In an embodiment of the first aspect, the second self-assembled monolayer has a chemical formula $(Z)_3SiR_3SH$, wherein $R_3$ is a carbon chain or a carbon chain interrupted by at least one heteroatom. Z can be independently selected from the group consisting of $CH_3$, Cl, $C_2H_5$, $OCH_3$, and $OC_2H_5$. $R_3$ can be a chain of n carbon atoms, wherein n is an integer of preferably from 1 to 30, more preferably from 1 to 18, or most preferably from 6 to 16. $R_3$ can be a chain of n carbon atoms interrupted by p heteroatoms, wherein n+p is an integer of preferably from 1 to 30, more preferably from 1 to 18, or most preferably from 6 to 16. The second self-assembling monolayer can have a chemical formula $SH(CH_2)_{10}SiCl_3$.

In an embodiment of the first aspect, the interconnect structure is a damascene structure. The damascene structure can be a dual damascene structure.

In a second aspect, a diffusion barrier layer in an interconnect structure is provided, wherein the diffusion barrier is a self assembled monolayer comprising a plurality of molecules of chemical formula $SH(CH_2)_{10}SiCl_3$.

In a third aspect, a releasable self-assembled monolayer is provided, the monolayer comprising a plurality of molecules of chemical formula $SH(CH_2)_9CH_3$, wherein the monolayer is configured to act as a protecting layer for a copper surface in an interconnect structure.

In a fourth aspect, a semiconductor device is provided, the device comprising a self-assembled monolayer selectively deposited onto at least one dielectric part of a damascene structure.

In an embodiment of the fourth aspect, the damascene structure is a dual damascene structure.

In an embodiment of the fourth aspect, the self-assembled monolayer comprises a plurality of molecules of chemical formula $SH(CH_2)_{10}SiCl_3$.

In an embodiment of the fourth aspect, the semiconductor device further comprises a direct copper-to-copper contact between copper at a bottom of a via and copper in a trench of an underlying level.

BRIEF DESCRIPTION OF THE DRAWINGS

All drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

FIGS. 2A-2D show dual damascene integration structures before and after SAM integration as described in prior art. FIG. 2A shows a dual damascene starting structure before SAM deposition. FIG. 2B shows a dual damascene structure with a uniform SAM deposition (prior art). FIG. 2C shows a dual damascene structure after seedlayer deposition onto SAM deposited surfaces. FIG. 2D shows the final dual damascene structure after seedlayer deposition, copper plating and subsequent planarization.

FIGS. 3A-3F show dual damascene integration structures before and after selective SAM integration as described in the preferred embodiments. FIG. 3A shows a dual damascene starting structure before SAM deposition. FIG. 3B shows a dual damascene structure with a depositing a sacrificial SAM-1 onto the existing Cu surface. FIG. 3C shows a dual damascene structure after depositing a permanent SAM-2 onto the dielectric. FIG. 3D shows the release of the sacrificial SAM-1 by thermal anneal. FIG. 3E shows seedlayer deposition onto SAM-2 coated dielectric and Cu surface. FIG. 3F shows the final dual damascene structure after seedlayer deposition, copper plating and subsequent planarization.

DETAILED DESCRIPTION OF THE PREFERRED EMBODIMENT

The following description and examples illustrate a preferred embodiment in detail, including molecules, the use of said molecules and a method for forming a selective self-assembled monolayer (SAM) and its applications. It will be appreciated that there are numerous variations and modifications possible. Accordingly, the description should not be deemed to limit the scope of the invention, which is defined by the claims.

SAM Selection for Selective Cu Diffusion Barrier Implementation

The key physical attributes needed for successful integration of a new barrier for Cu dual damascene (DD) are good adhesion, good thermal stability, low defectivity and robust electrical connection between the top (n) and bottom (n–1) metals. An added benefit to the integration of a selective SAM deposition process is the intimate Cu—Cu contact between the via bottom (metal n) and the underlying metal (n–1). The elimination of the refractory metal diffusion layer between Cu layers (n & n–1) represents a potential electro-migration (EM) benefit in that the flux divergence at the via is eliminated and the intrinsic Cu EM can be realized.

For the purpose of the preferred embodiments, damascene processing should be understood as a dielectric etch approach for fabricating (copper) interconnect structures. A wide variety of applications (e.g., DRAM, ASIC, MPU, and SOC) involve the damascene sequence. Damascene refers to the process by which a metal conductor pattern is embedded within a non-conducting (dielectric) material. The process of creating single damascene (SD) structures comprises first etching a trench or groove in a planarized dielectric layer followed by filling said trench with a metal such as copper (further involving planarization of the metal towards the dielectric). In dual damascene (DD) the process sequentially creates embedded vias and trenches, with the vias forming the vertical connections from one layer of circuitry (trenches) to the next. Or in other words, in a dual damascene structure a second level of dielectric is involved in which a series of holes (i.e. vias or contacts) are etched and filled with metal, said holes making contact to the trenches in the dielectric level underneath.

Figure 1:
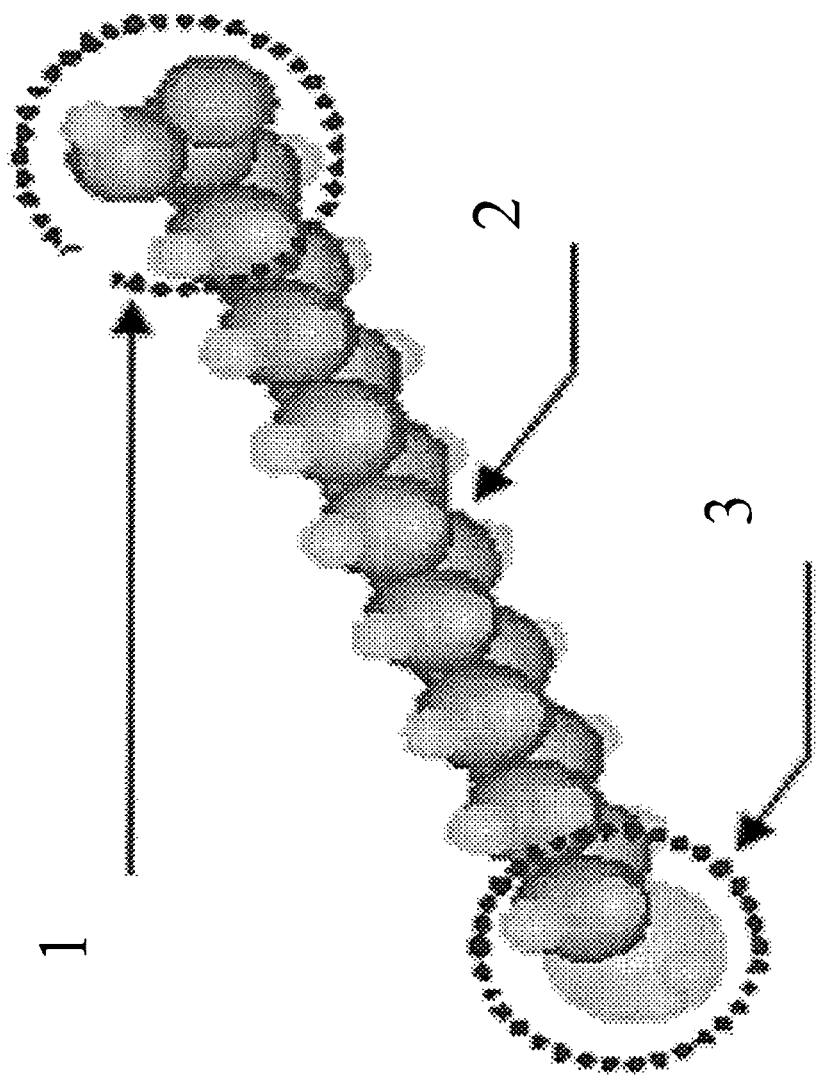
FIG. 1 shows a schematic representation of a SAM molecule consisting of a terminal functional group 1, a hydrocarbon chain 2 and a head group 3.

For the purpose of the preferred embodiments, self-assembled monolayers (SAM) should be understood as a relatively ordered assembly of molecules that spontaneously adsorb (also called chemisorb) from either the vapour or liquid phases on a surface. In general the SAM film is engineered by the selection of the head group, the hydrocarbon comprising chain and terminal group of the molecule as defined in FIG. 1. The head 3, the terminal group 1 and hydrocarbon chain length 2 can be selected independently. In the description below, the head group 3 is defined as the end of the SAM molecule that is compatible with and bonds well to the substrate, preferably here Cu or SiO$_2$. The terminal group 1 is defined as the end that is exposed at the SAM-gas/liquid interface. The chain length of the hydrocarbon 2 influences the order and packing density of the SAM.

It is an object of the preferred embodiments to provide a method for selectively depositing a SAM barrier layer. To realize the final selective deposition of a SAM barrier, preferably two SAM films are used. Preferably a first SAM layer, referred to as SAM-1, is applied first as a releasable and temporary masking film and is selectively deposited on the metal surface but not on the dielectric. The metal is preferably copper. A second SAM layer, referred to as SAM-2, is then selectively deposited on the dielectric. SAM-2 is a permanent (diffusion barrier) layer. The masking film (SAM-1) will protect the copper surface from damage (such as oxidation and reduction reactions occurring at the copper surface of the underlying metal (n–1) at the via bottom) during SAM-2 deposition. Furthermore it will protect the copper surface from SAM-2 deposition. After the deposition of SAM-2, SAM-1 is preferably released from the copper surface, most preferred said release process is a low temperature anneal (less than 150 degrees Celsius).

The selective nature of the SAM barrier depositions and release, as described here is the result of the selection of the terminal and head groups of the SAM molecules. Preferably the head group of SAM-1 has strong adhesion (bonding) to the metal surfaces and weak adhesion to dielectric surfaces. The terminal group of SAM-1 has weak adhesion to the metal and dielectric surfaces. These adhesion characteristics result in the selective deposition where the head group is attached to the metal with the terminal group exposed at the gas/liquid-SAM interface and there is no deposition on the dielectric surface. SAM-1 is further selected for its low thermal stability. The terminal group of SAM-2 has strong adhesion (bonding) to metal surfaces and weak adhesion to dielectric and SAM-1 coated surfaces.

In a preferred embodiment, SAM-1 is characterized as comprising at least one molecule with the chemical formula: X—R$_1$—SH or X—R$_1$—S—S—R$_2$—Y or R$_1$—S—R$_2$ wherein R$_1$ and R$_2$ are hydrocarbon segments comprising chains of n carbon atoms, optionally interrupted by heteroatoms. X—R$_1$—S—S—R$_2$—Y based molecules will break into two R—S subunits forming a SAM-1 molecule identical to X-R1-SH. R$_1$ and R$_2$ are independent of each other and can have the same chemical formula or can be different. X and Y can have the same chemical formula or can be different. X and Y are chemical groups selected such that there is essentially no chemical reaction between X and the metal (Cu) or dielectric surfaces. This means that there is no competition between the sulphur atom and X related to chemisorption on the metal surface.

$R_1$ or $R_2$ used in SAM-1 is a chain of n carbon atoms, optionally interrupted by p heteroatoms wherein n or (n+p) is an integer between 1 and 30, more preferred between 1 and 18, and most preferred between 6 and 16. Said (hydro)carbon chain promotes the formation of a self-assembling monolayer. Said carbon chain may be understood as including an alkyl, alkenyl, alkynyl, cyclic alkyl, aryl, alkyl bound to aryl, alkenyl bound to aryl, alkynyl bound to aryl. Said (hydro)carbon chain can be branched. All combinations of $R_1$, $R_2$, the number of carbon atoms and the interruption by heteroatoms are possible.

In a most preferred embodiment, the molecule forming the SAM-1 layer is X—$R_1$—SH, $R_1$ being an alkyl chain —$(CH_2)_n$—. Preferably n is between 1 and 30, more preferred between 1 and 18 and most preferred between 6 and 16. Most preferred the X group is a methyl ($CH_3$) or hydrogen (H) group. An example of said composition is $SH(CH_2)_9CH_3$ (also referred to as $C_{10}H_{21}SH$, decylmercaptan, 1-decanethiol or 1-mercaptodecane).

In an alternative embodiment, the molecule forming the SAM-1 is X—$R_1$—SH, $R_1$ comprising an alkyl group and an aryl group. $X_1$, $X_2$, $X_3$, $X_4$, $X_5$ and $X_6$ are preferably H, $CH_3$ or $(CH_2)_n$.

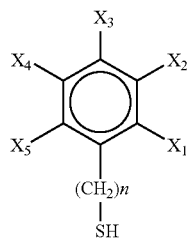

In Another alternative embodiment, the molecule forming the SAM is X—$R_1$—SH, $R_1$ comprising an aryl group. $X_1$, $X_2$, $X_3$, $X_4$, $X_5$ and $X_6$ are preferably H, $CH_3$ or $(CH_2)_n$.

Preferably SAM-2 is characterized as comprising at least one molecule with the chemical formula: $(Z)_3Si$—$R_3$—SH wherein $R_3$ is a carbon comprising chain of carbon atoms (optionally interrupted by heteroatoms), $(Z)_3Si$ is the head group and the SH group is the terminal group of the SAM-2 molecule. The length of the carbon comprising chain $R_3$ is such that it is long enough to obtain a good packing density (leading to a good surface coverage of the dielectric) but still keeping the SAM-2 molecule in a liquid state at room temperature. The carbon chain is preferably an alkyl chain which is formed by alkanes. This alkyl chains will lead to Van der Waals interactions obtaining a close packed order in the SAM-2 monolayer. The Z component in the head group is preferably a $CH_3$, Cl, $C_2H_5$, $OCH_3$, $OC_2H_5$ group. All combinations of these groups are possible to define Z. Examples of possible head groups are $SiCl_3$, $Si(OCH_3)_3$, $SiCl(OCH_3)_2$, etc. The head group is chosen such that there is a good binding or strong adhesion to the dielectric combined with a good surface coverage of the dielectric. The head group of SAM-2 is further characterized as having a weak adhesion to copper and SAM-1 coated surfaces. The terminal group (SH is most preferred but other examples are possible) of SAM-2 must have strong adhesion (bonding) to metal surfaces and weak adhesion to dielectric and SAM-1 coated surfaces.

In a preferred embodiment, SAM-2 is characterized as comprising at least one molecule with the chemical formula: $(Z)_3Si$—$(CH_2)_n$—SH wherein n is preferably between 1 and 30, more preferred between 1 and 18 and most preferred between 6 and 16. Z is preferably a $CH_3$, Cl, $C_2H_5$, $OCH_3$, $OC_2H_5$ group. All combinations of these groups are possible to define Z. Examples of possible head groups are $SiCl_3$, $Si(OCH_3)_3$, $SiCl(OCH_3)_2$, etc. An example of a preferred SAM-2 molecule has following structure: $SH(CH_2)_{10}SiCl_3$.

In a preferred embodiment the dielectric surface is a Si based dielectric. Examples of these Si based dielectric materials, but not limited hereto, are materials such as $SiO_2$, SiC, SiCO(H), SiC(N), including Silicon based low-k films. Surface treatments of low-k films to make the surface more hydrophilic may be necessary in some cases. The metal surface is preferably a copper containing surface and is part of a copper interconnect structure such as a via or trench in a dual damascene structure.

Preferably the principle of selectively depositing a thin Self Assembled Mono-layer (SAM) will be used for selective deposition of a copper diffusion barrier in dual damascene interconnect structures. The principle of selectively depositing a thin Self Assembled Mono-layer (SAM) can also be applied as diffusion barriers for other conductive materials and in future technologies.

Selective Self-Assembled Monolayers For Use in Copper (Dual) Damascene Structures The method of the preferred embodiments for selectively depositing a SAM diffusion barrier layer is applied for diffusion barrier deposition in damascene structures, preferably in dual damascene structures.

FIGS. 2A to 2D show schematic diagrams of a Dual Damascene (DD) structure prior to and after the SAM and Cu seed depositions as described in the prior art. In FIG. 2B, a uniform SAM deposition 5 is assumed on all surfaces. The SAM molecule as described in the prior art corresponds to $SH(CH_2)_3Si(OCH_3)_3$. The final obtained integrated structure as shown in FIG. 2D (after copper seed deposition and Cu plating) is expected to have marginal or poor SAM-seed adhesion 6 over the via structure and questionable electrical connection between the upper Cu seed layer 7 and lower metal 4. In FIGS. 3A to 3F, using the method of the preferred embodiments, a selective SAM-2 8 deposition is assumed to dielectric surfaces 11 only. In this case there will be no SAM barrier between the upper and lower metal (indicated as 9 in FIG. 3F). The intimate contact of the top and bottom Cu provides good electrical contact and eliminates the Cu flux divergence at the lower metal-via interface, which is present in refractory metal barrier cases. The absence of the Cu flux divergence is expected to have positive effect on the EM resistance and potentially eliminate Stress Induced Voiding (SIV) at the bottom of the via.

Using FIGS. 3A to 3F, the preferred method can be summarized as follows. FIG. 3A shows a dual damascene starting structure before SAM deposition. As shown in FIG. 3A, the method starts from a substrate, said substrate having a first dielectric layer 10 having a first copper structure 4 (also referred to as metal n−1) embedded in said first dielectric layer 10. Onto said first dielectric layer 10, a second dielectric layer 11 is deposited and a dual damascene structure is patterned into said second dielectric 11 layer e.g. using a via first approach. FIG. 3B shows the dual damascene structure after depositing a sacrificial SAM-1 13 onto the existing Cu surface 4. FIG. 3C shows the dual damascene structure after depositing a permanent SAM-2 8 only onto the dielectric surfaces 11. FIG. 3D shows the release of the sacrificial SAM-1 13 by thermal anneal. Said thermal anneal is preferably at temperatures at about 100 to 150 degrees Celsius, or in other words preferably above 100 degrees Celsius (e.g. preferred temperature of 150 degrees Celsius). The maximum anneal temperature is defined by the thermal stability of the second self-assembled monolayer (SAM-2). In the preferred embodiments the chemical structure of SAM-2 is such that it has preferably a thermal stability above 500 degrees Celsius (no desorption of SAM-2 at temperatures below 500 degrees Celsius). The thermal anneal of SAM-1 is further characterized as a rapid thermal anneal (e.g. 0.4 degrees per second) which is performed within a few minutes (e.g. 5 minutes). FIG. 3E shows seedlayer deposition 7 onto SAM-2 coated dielectric surfaces 8 and Cu surface 4. FIG. 3F shows the final dual damascene structure after seedlayer deposition 7, copper plating 12 (resulting in metal n) and subsequent planarization.

EXAMPLES

Example 1

SAM Preparation and Coating onto Wafer Substrates by Liquid Immersion

SAM-1 was prepared by immersion of Cu plated wafer substrates in a dilute solution of 1-decanethiol. The dilute solution was obtained by dilution of 1 ml of concentrated 1-decanethiol in 5000 ml solvent, using isopropyl alcohol (IPA) as solvent at ambient temperature for 2 h. The SAM-1 chemical structure is $CH_3-(CH_2)_9-SH$, also referred to as C10 or 1-decanethiol. The SAM-1 material has 96% purity and is obtained from Sigma-Aldrich. The C10-modified wafer was then rinsed with copious amounts of IPA (30 sec) and dried under nitrogen. The substrates were then electroplated with copper. The Cu substrates were cleaned by immersion in 3.7% hydrochloric acid for 5 min. followed by rinsing with copious amounts of deionised water (2 min) and then solvent (30 sec) immediately before immersion in thiol solution.

SAM-2 was prepared by rinsing $SiO_2$ substrate in toluene (10 sec) and then immersion in a dilute solution of mercaptopyltrimethoxy-silane. The dilute solution was obtained by dilution of 10 ml of concentrated mercaptopropyltrimethoxy-silane in 5000 ml solvent, using toluene as solvent at ambient temperature for 1 h. Concentrated mercaptopropyltrimethoxy-silane (also referred to as MPTMS) was used as received from Gelest. The MPTMS-modified wafer was then rinsed with copious amounts of toluene (30 sec), then, acetone (30 sec) and, finally, ethanol (30 sec) before being dried under nitrogen flow.

In order to verify that SAM-1 does not adsorb on $SiO_2$, $SiO_2$ substrates were also exposed to SAM-1 under the same conditions as described for Cu. To investigate the adsorption of SAM-2 on Cu, Cu substrates were exposed to SAM-2 under the same conditions as described for $SiO_2$. Further, SAM-1 films on Cu and SAM-2 films on $SiO_2$ were exposed to SAM-2 and SAM-1, respectively.

Example 2

SAM Preparation and Coating onto Wafer Substrates by Vapour Deposition

SAM-1 or SAM-2 can also be adsorbed from the vapour phase. SAM-1 or SAM-2 was contained in a pyrex glass tube and connected via a gas line to a high vacuum system containing the substrate of interest. There was a valve between the vacuum system and the glass tube. By opening this valve, the substrate contained in the vacuum system was exposed to the vapour of SAM-1 or SAM-2 for different times depending on the dosing pressure.

Example 3

Contact Angle (CA) Measurements

Water CA measurements were used to assess SAM quality, more specifically adhesion properties to the different substrates and thermal stability of the SAM layers. Static contact angles of deionized water deposited on the samples were measured in air using a software-controlled Video Contact Angle System OCA-20 (DataPhysics). All angles measured are subject to an error of ±0.1°. In addition, a variation of ±2.5° was typically observed across a given blanket Cu wafer. A minimum of 6 measurements/sample were performed for all samples.

From the contact angle measurements it was concluded that SAM-1 is deposited on Cu plated substrates (D07) but not on $SiO_2$ substrates (D09). SAM-2 is deposited on the $SiO_2$ substrates (D08)

SAM-1 on Cu substrates is released (D07, D07PA) by the anneal, 250° C. for 10 min in an $N_2$ ambient. SAM-2 on $SiO_2$ is not affected (D08, D08PA) by the anneal and thus thermally stable.

Sequential treatments of SAM-1 and SAM-2, required for the selective SAM deposition, were also investigated. SAM-½ on Cu (D05) has the same CA as SAM-1 on Cu (D07) indicating that SAM-2 is not deposited on SAM-1. SAM-½ on $SiO_2$ (D18) has the same CA as SAM-2 on $SiO_2$ (D08) consistent with the prior result that SAM-1 does not deposit on $SiO_2$. SAM-½ on Cu after anneal (D15PA) has the same CA as post anneal SAM-1 on Cu (D07PA) indicating that the all material on the Cu is release after the 2 step process. SAM-½ on $SiO_2$ after anneal (D18PA) has the same CA as post anneal SAM-2 on SiO2 (D08PA) indicating that the 2 step process is thermally stable like the SAM-2 on $SiO_2$ case.

TABLE 1

Contact Angle data

| Sub | SAM | Anneal | Wafer | Phase 1 | Phase 2 | Anal Meth |
|---|---|---|---|---|---|---|
| Cu | 1 | No | D07 | 100 | 126 | CA |
| Cu | 1 | Yes | D07 PA | 73 | 50 | CA |
| Cu | 2 | No | D03 | 57 | 56 | CA |
| Cu | 2 | Yes | D03 PA | 62 | 41 | CA |
| Cu | 1/2 | No | D05 | 92 | 116 | CA |
| Cu | 1/2 | Yes | D05 PA | 60 | 62 | CA |
| SiO2 | 1 | No | D09 | 8 | 5 | CA |
|  |  | Yes | D09 PA |  | 22 | CA |
| SiO2 | 2 | No | D08 | 53 | 57 | CA |
| SiO2 | 2 | Yes | D08 PA | 54 | 59 | CA |
| SiO2 | 1/2 | No | D18 | 45 | 52 | CA |
| SiO2 | 1/2 | Yes | D18 PA | 39 | 53 | CA |
| Cu Ref | None | No | D06 | 59 | 58 | CA |
|  |  | Yes | D06 PA | 15 | 36 | CA |
| SiO2 Ref | None | No | D12 | 11 | 10 | CA |
|  |  | Yes | D12 PA | 12 | 43 | CA |

PA = Post Anneal

Example 3

Adhesion Measurements

Adhesion measurements were made on 4 wafers (indicated as D13, D14, D15 and D16 in Table 2) that continued processing (Cu seed deposition) after the SAM deposition. The adhesion measurements were performed by cleaving 2 sections (cords) from the wafer, applying tape (Scotch "red" crystal clear tape) to the pieces and pulling the tape from the cleaved edge of the wafer. The tape is pulled with a steady motion parallel to the wafer surface. Several (5-6) pieces of tape are attached to the wafer and pulled sequentially. The test was performed on 2 pieces per wafer to get sufficient sample size. Each tape pull is considered a trial. Failure is defined as a test which results in Cu on the tape. The yield is calculated by #_pass/#_trials (%). The results of the adhesion test showed good adhesion properties for $SiO_2$/SAM-2/Cu (D16) and a poor adhesion for Cu/SAM-1/Cu & Cu/SAM-1/SAM-2/Cu (D13 & D15).

TABLE 2

Adhesion test results

| wafer | substrate | SAM | Adhesion Pass | trials | yield |
|---|---|---|---|---|---|
| D13 | Cu | 1 | 0 | 11 | 0% |
| D14 | Cu | 2 | 11 | 11 | 100% |
| D15 | Cu | 1 + 2 | 0 | 10 | 0% |
| D16 | SiO2 | 2 | 10 | 10 | 100% |

Example 4

Proof of Concept for Selective Process

Figure 4:
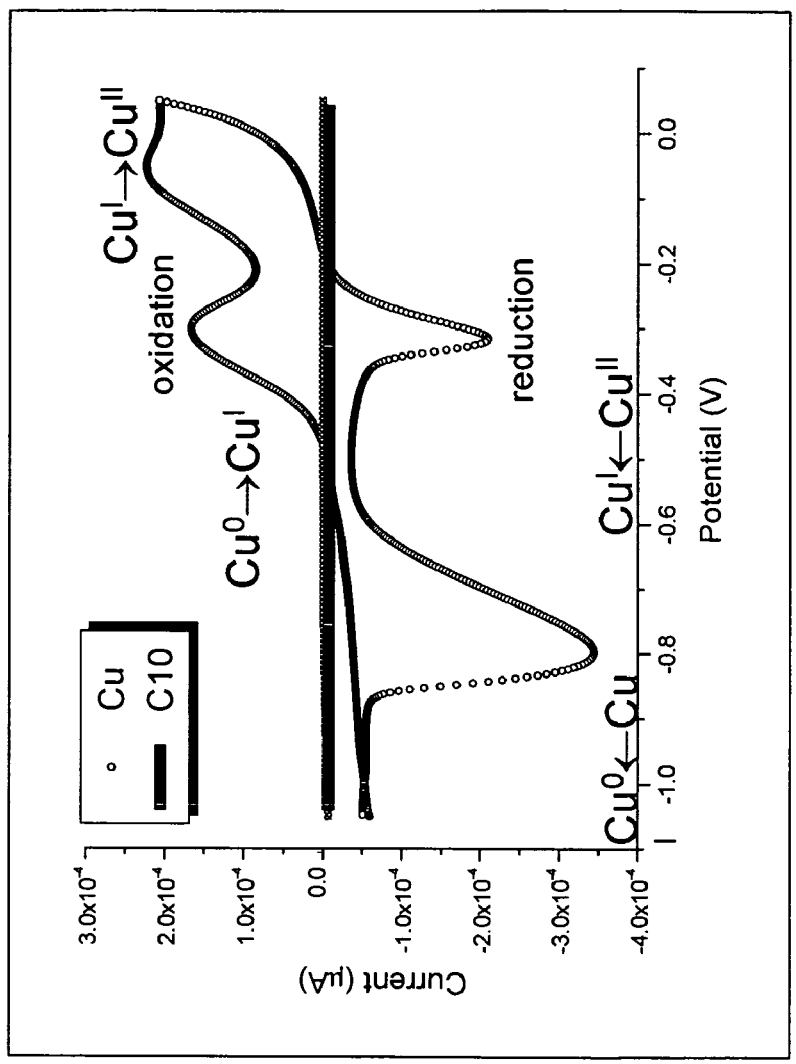
FIG. 4 illustrates cyclic voltammograms collected with a scan rate 50 $mVs^{-1}$ in aqueous solutions of 0.1 M NaOH showing the influence of SAM-1 (1-decanethiol, C10) on Cu oxidation and reduction. Films of SAM-1 were formed by immersion (>2 hours) in $10^{-3}$ M solutions in isopropanol.

Cyclic voltammetry was used to evaluate SAM-1 stability (after depositing said SAM-1 molecule on a Cu surface) against electrochemically induced oxidation-reduction corrosion. FIG. 4 shows current-potential cyclic curves in 0.1 M aqueous NaOH solution with a positive sweep from −1.05 to 0.05 V (versus Ag/AgCl) at a scan rate of $0.05 Vs^{-1}$. For clean, non-passivated Cu (or in other words a copper surface without SAM-1 deposition), the anodic and cathodic peaks and their assignments are indicated. The corresponding current-potential cyclic curve for Cu passivated with SAM-1 (1-decanethiol, also referred to as Decylmercaptan, $C_{10}H_{21}SH$ or "C10") is also shown in FIG. 4. The passivation was optimised by forming films of SAM-1 on the Cu-surface by immersion for a minimum of 2 hours in $10^{-3}$ M 1-decanethiol solution in isopropanol) to completely quench Cu oxidation-reduction processes.

Figure 5:
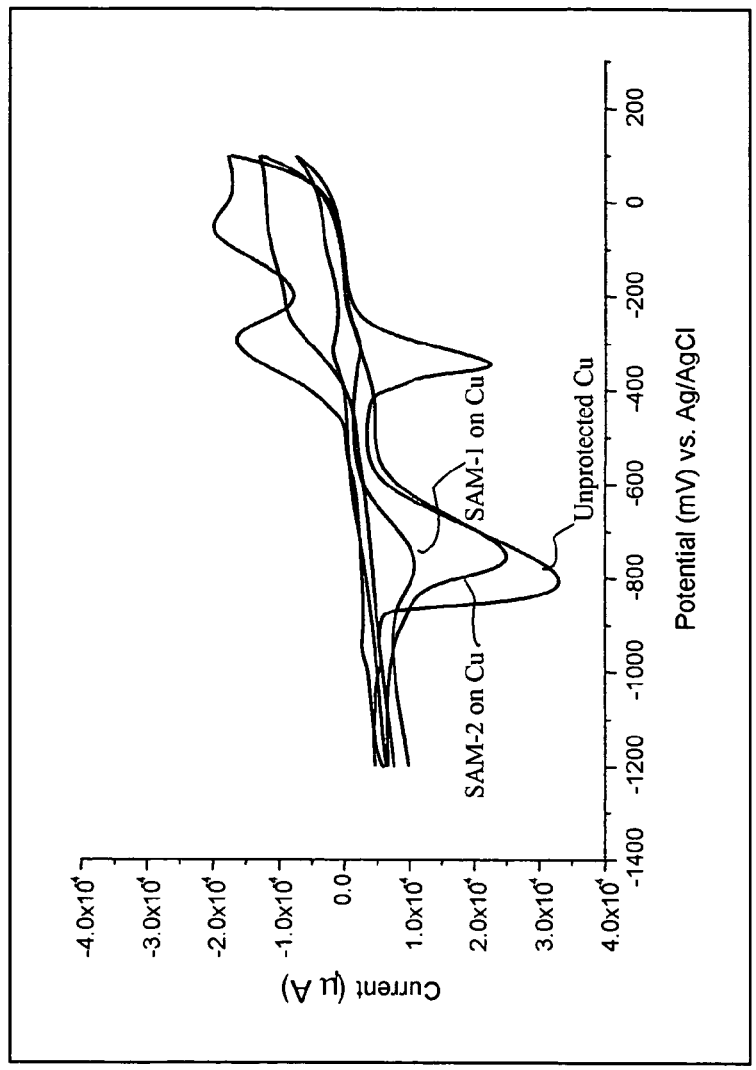
FIG. 5 illustrates cyclic voltammograms collected with a scan rate 50 mVs$^{-1}$ in aqueous solutions of 0.1 M NaOH showing the influence of SAM-1 and SAM-2 on Cu oxidation and reduction. Films were formed by immersion of Cu for 1 hour in a $10^{-3}$ M 1-decanethiol or MPTMS solution in isopropanol and toluene, respectively.

In FIG. 5, the current-potential cyclic curves for Cu passivated with SAM-2 show that this molecule also forms a layer on Cu that is partially passivating under the film formation conditions employed that are comparable with those used to form a SAM-2 film on $SiO_2$ (immersion for 1 hour in a $10^{-3}$ M Mercaptopropyltrimethoxysilane (MPTMS) solution in toluene). Clearly, the passivation process was not optimum, i.e., the Cu oxidation-reduction processes are suppressed but not completely quenched. Nevertheless, this experiment confirms that SAM-2 does form a film on Cu, in agreement with literature. Hence this result shows the need to protect the Cu-surface (in a dual damascene structure) during SAM-2 processing of Cu—$SiO_2$ structures.

Example 5

Screening of SAMs as Potential Cu Diffusion Barriers

Figure 6:
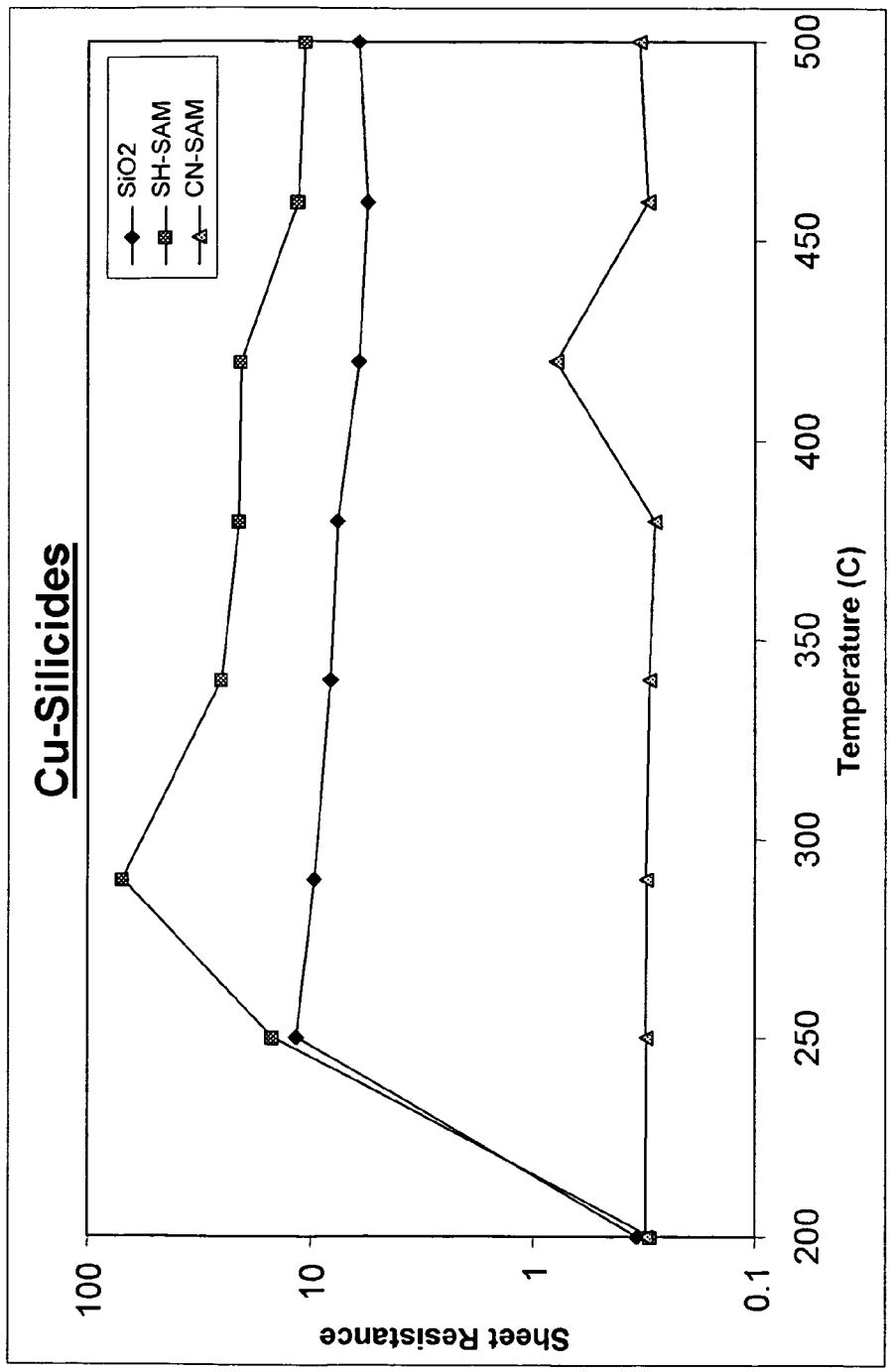
FIG. 6 shows the sheet resistance (Rs) versus annealing temperature plots for Cu/SAM/SiO$_2$ where the SAM molecule is CN(CH$_2$)$_{11}$SiCl$_3$ (CN-SAM) or HS(CH$_2$)$_3$Si(OCH$_3$)$_3$ (SH-SAM). A reference Cu/SiO$_2$ sample is shown for comparison.
Figure 7:
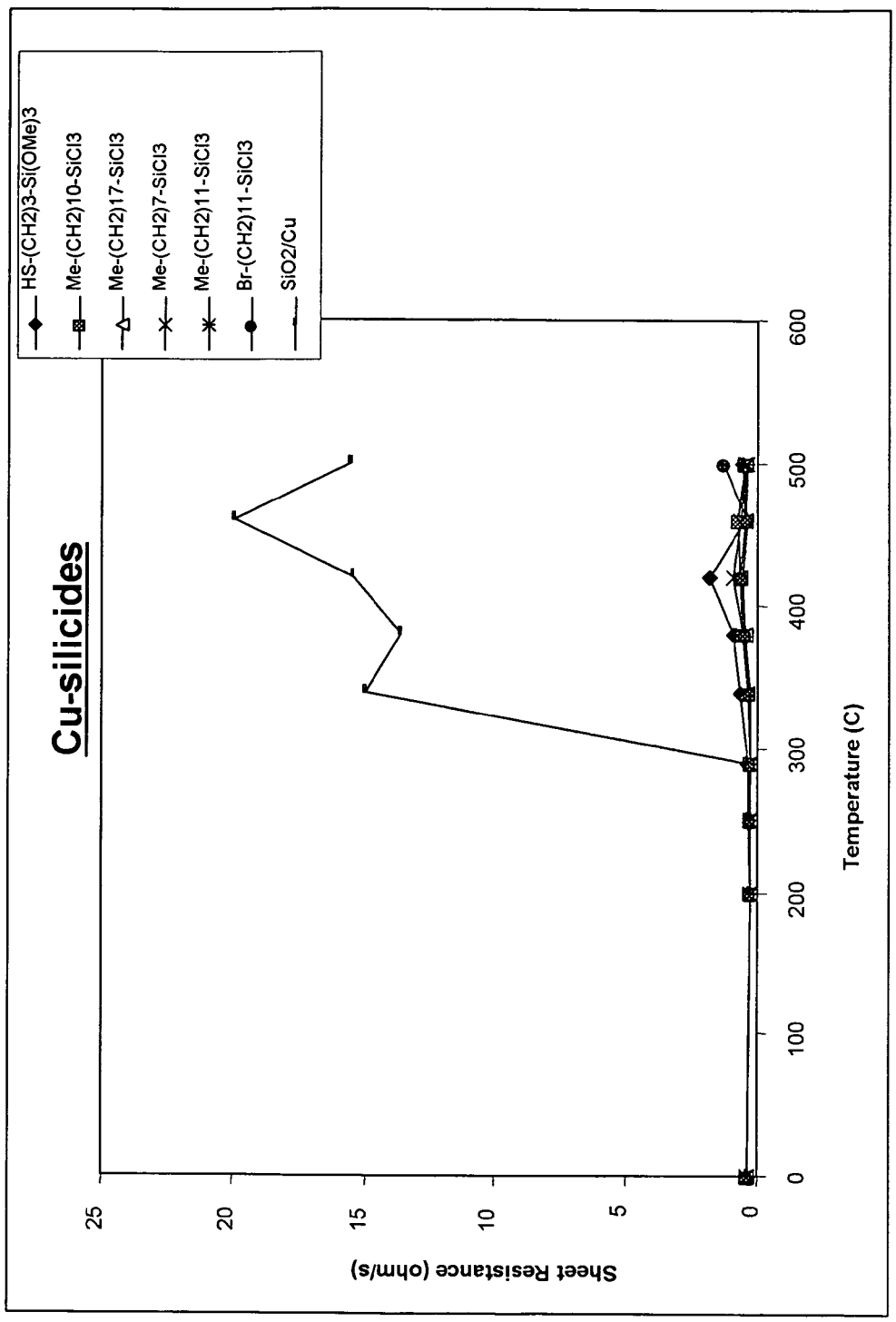
FIG. 7 shows the sheet resistance (Rs) versus annealing temperature plots for Cu/SAM/SiO$_2$ where the SAM molecule is CH$_3$(CH$_2$)$_7$SiCl$_3$, CH$_3$(CH$_2$)$_{10}$SiCl$_3$, CH$_3$(CH$_2$)$_{11}$SiCl$_3$, CH$_3$(CH$_2$)$_{17}$SiCl$_3$, Br(CH$_2$)$_{11}$SiCl$_3$ or HS(CH$_2$)$_3$Si(OCH$_3$)$_3$. A reference Cu/SiO$_2$ sample is shown for comparison.
Figure 8:
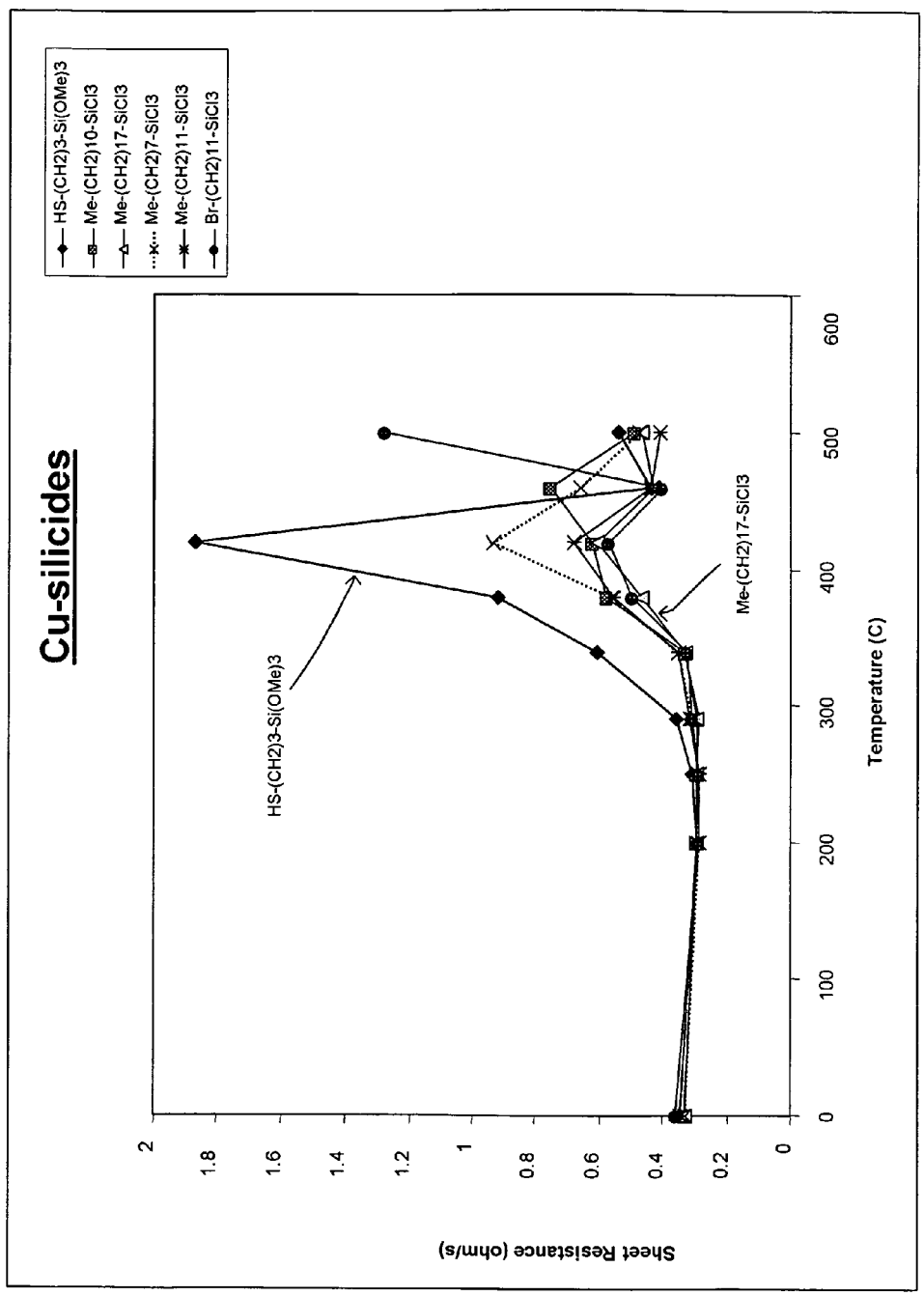
FIG. 8 shows the sheet resistance (Rs) versus annealing temperature plots for Cu/SAM/SiO$_2$ where the SAM molecule is CH$_3$(CH$_2$)$_7$SiCl$_3$, CH$_3$(CH$_2$)$_{10}$SiCl$_3$, CH$_3$(CH$_2$)$_{11}$SiCl$_3$, CH$_3$(CH$_2$)$_{17}$SiCl$_3$, Br(CH$_2$)$_{11}$SiCl$_3$ or HS(CH$_2$)$_3$Si(OCH$_3$)$_3$. (similar to FIG. 7 without showing the reference Cu/SiO$_2$ sample).

As a rough evaluation of SAM barrier properties against Cu diffusion we annealed Cu/SAM/$SiO_2$ samples to different temperatures (200, 250, 290, 340, 380, 420, 460 and 500° C.) and then measured the sheet resistance (Rs). A high increase in sheet resistance (Rs) indicates that $Cu_3Si$ is formed and implies that there is failure of the barrier for copper diffusion inhibition (via openings or pin holes in the barrier). The SAM-2 molecules were evaluated in terms of different alkyl chain lengths, head groups and terminal groups as listed in Table 3. The resulting Rs versus annealing temperature plots are shown in FIGS. 6, 7 and 8.

TABLE 3

Name, chemical formula, abbreviation, and water contact angle (CA) measured for as-prepared SAMs formed on $SiO_2$.

| Name | Chemical Formula | Abbreviation | CA° |
|---|---|---|---|
| Octyltrichlorosilane | $CH_3(CH_2)_7SiCl_3$ | $CH_3$—$C_7$-SAM | 111.5 |
| undecyltrichlorosilane | $CH_3(CH_2)_{10}SiCl_3$ | $CH_3$—$C_{10}$-SAM | 113.0 |
| dodecyltrichlorosilane | $CH_3(CH_2)_{11}SiCl_3$ | $CH_3$—$C_{11}$-SAM | 112.8 |
| octadecyltrichlorosilane | $CH_3(CH_2)_{17}SiCl_3$ | $CH_3$—$C_{17}$-SAM | 110.8 |
| 11-bromoundecyltrichlorosilane | $Br(CH_2)_{11}SiCl_3$ | Br-SAM | 86.6 |
| 11-cyanoundecyltrichlorosilane | $CN(CH_2)_{11}SiCl_3$ | CN-SAM | 77.6 |
| 3-mercaptopropyltrimethoxysilane | $HS(CH_2)_3Si(OCH_3)_3$ | SH-SAM | 54 |

FIG. 6 shows a comparison between CN-SAM and SH-SAM and a reference Cu/$SiO_2$ sample. In these cases, Cu diffuses through the SAM-2 and thin oxide layer to form Cu silicide upon annealing above 200° C. Clearly, the presence of SAM-SH is similar to the reference sample. In contrast, CN-SAM shows evidence of inhibiting Cu diffusion. The poor diffusion inhibition of the SH-SAM molecule is due to a too short alkyl chain, which leads to pins holes, the CN-SAM molecule shows good diffusion inhibiting properties. The terminal group "SH" of the SH-SAM is however preferred to have good copper to copper bonding.

FIGS. 7 and 8 show a comparison between various SAM-2 molecules and a reference Cu/$SiO_2$ sample. In this case, the experiments were performed on wafer pieces attached to a wafer and hence there is a temperature offset compared with the experiment performed on full wafers plotted in FIG. 6. From FIGS. 7 and 8, it is observed that Cu could diffuse through the SAM-2 and thin oxide layer to form Cu silicide upon annealing above 250° C. The resulting Rs depends strongly on the SAM employed. There is evidence of a trend. The longer the alkyl chain, the better the barrier properties. Also, adding a reactive terminal group such as Br instead of the unreactive methyl group enhances barrier properties. The very short chain SH-SAM shows the poorest barrier performance but is still better than $Cu/SiO_2$.

Example 6

Desorption of SAM-1 from Cu-Surface:
Investigation by Thermal Desorption Spectroscopy
(TDS)

Thermal Desorption Spectroscopy was used to investigate the thermal desorption of SAM-1 from a Cu surface. Thermal Desorption Spectroscopy (TDS), also named Temperature Programmed Desorption (TPD) is a relatively simple technique in surface science for evaluating desorption of compounds from a surface.

A substrate, in this example a wafer surface, is plated with copper. Said substrate with copper on top of it, is immersed in a $10^{-1}$ M $CH_3(CH_2)_9SH$(SAM-1) solution (in alcohol) for 2 hours and subsequently rinsed in alcohol (dried in nitrogen flow).

In the TDS experiment to investigate the SAM-1 desorption from a Cu surface, we heat the SAM-1 covered Cu-surface sample with a defined heating rate $\Delta=dT/dt$, from a temperature below to a temperature above the expected desorption temperature of the adsorbate (SAM-1), and simultaneously detect the desorbing species with a mass spectrometer.

Figure 9:
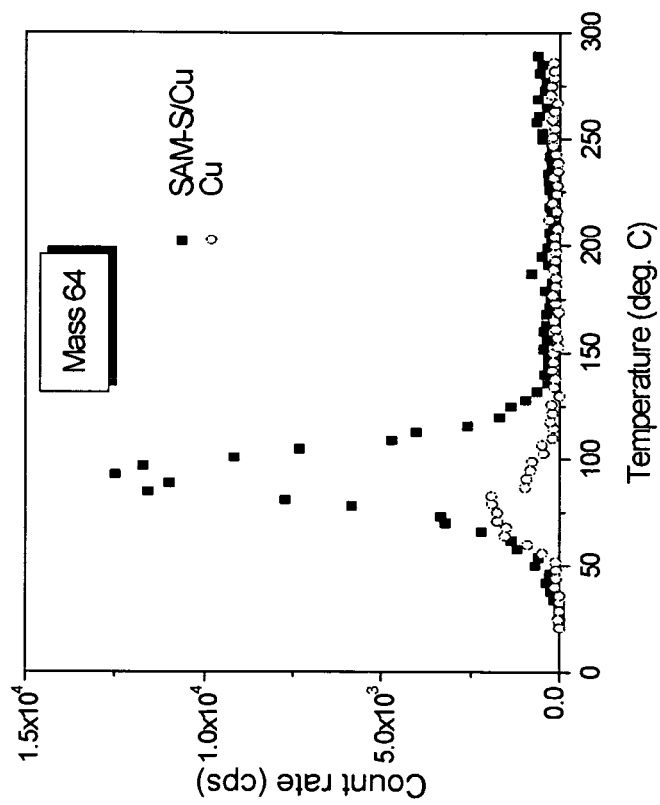
FIG. 9 illustrates the Thermal Desorption Spectra (TDS) for CH$_3$(CH$_2$)$_9$S—Cu (or in other words CH$_3$(CH$_2$)$_9$SH bonded to a Cu-surface). It clearly shows a desorption maximum for CH$_3$—(CH$_2$)$_9$—SH bonded to copper at less than 100 degrees Celsius.

For SAM-1 desorption studies the temperature was ramped up by 0.4 degrees per second (=rapid) during the TDS analysis. FIG. 9 illustrates the TDS spectra for $CH_3(CH_2)_9S$—Cu (or in other words $CH_3(CH_2)_9SH$ bonded to a Cu-surface). It clearly shows a desorption maximum for $CH_3(CH_2)_9SH$ bonded to copper at 100 degrees Celsius.

During processing it is therefore desired to have a thermal anneal which is rapidly ramped up to 150 degrees Celsius and which is held at 150 degrees for approximately 5 minutes.

The thermal release (or thermal stability) for the preferred $SH(CH_2)_{10}SiCl_3$ (SAM-2) molecule is above 500 degrees Celsius.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A semiconductor device, the device comprising a damascene copper interconnect structure and a self-assembled monolayer, wherein the damascene copper interconnect structure comprises exposed dielectric parts and exposed copper parts, and wherein the self assembled monolayer is selectively deposited exclusively onto the exposed dielectric parts by bonding through a head group, but is not deposited on the exposed copper parts of the damascene copper interconnect structure, wherein the self-assembled monolayer comprises a plurality of molecules of chemical formula $(Z)_3Si$—$R_3$—SH, wherein —$R_3$— is an alkyl chain, wherein —SH is a terminal group, wherein the head group is —$Si(Z)_3$, and wherein Z is independently selected from the group consisting of $CH_3$, Cl, $C_2H_5$, $OCH_3$, and $OC_2H_5$.

2. The semiconductor device of claim 1, wherein the damascene copper interconnect structure is a dual damascene structure.

3. The semiconductor device of claim 1, wherein said self-assembled monolayer comprises a plurality of molecules of chemical formula $SH(CH_2)_{10}SiCl_3$.

4. The semiconductor device of claim 1, further comprising a direct copper-to-copper contact between copper at a bottom of a via and copper in a trench of an underlying level.

5. The semiconductor device of claim 1, wherein R is an alkyl chain of n carbon atoms, and wherein n is an integer from 1 to 30.

6. The semiconductor device of claim 5, wherein n is an integer from 1 to 18.

7. The semiconductor device of claim 6, wherein n is an integer from 6 to 16.

8. The semiconductor device of claim 1, wherein $R_3$ is an alkyl chain of formula —$(CH_2)_n$—, wherein n is an integer of from 1 to 30.

9. The semiconductor device of claim 8, wherein n is an integer from 1 to 18.

10. The semiconductor device of claim 9, wherein n is an integer from 6 to 16.

* * * * *